United States Patent [19]

Dil

[11] Patent Number: 4,746,792
[45] Date of Patent: May 24, 1988

[54] OPTICAL TRANSDUCER ELEMENT AND DISPLACEMENT METER COMPRISING SUCH AN ELEMENT

[75] Inventor: Jan G. Dil, Almelo, Netherlands

[73] Assignee: U.S. Philips Corp., New York, N.Y.

[21] Appl. No.: 914,050

[22] Filed: Oct. 1, 1986

[30] Foreign Application Priority Data

Oct. 1, 1985 [NL] Netherlands .................... 8502679

[51] Int. Cl.⁴ ............................................ G01D 5/34
[52] U.S. Cl. .......................... 250/231 SE; 250/237 G; 340/347 P
[58] Field of Search ..................... 250/231 SE, 237 G; 340/347 P; 356/373, 375

[56] References Cited

U.S. PATENT DOCUMENTS 4,528,448 7/1985 Doggett .......................... 250/237 G
4,577,101 3/1986 Bremer et al. .................. 340/347 P Primary Examiner—David C. Nelms
Assistant Examiner—Stephone B. Allen
Attorney, Agent, or Firm—David R. Treacy

[57] ABSTRACT

Displacement of an object is sensed by a transducer element having light first strips and dark second strips alternating in a direction of object displacement. The first strips are formed as phase gratings having grating lines extending in the direction of displacement and having a width equal to half the grating period and a depth such that the zero-order diffraction beam is suppressed. The lines may be grooves or ribs, separated by lands which are at the same level as the second strips. A device, for measuring displacement of an object on which such an element is fixed, includes an imaging system having an aperture limited such that first and higher-order diffraction beams from the phase grating are not transmitted to a radiation-sensitive pattern detection system.

20 Claims, 4 Drawing Sheets

OPTICAL TRANSDUCER ELEMENT AND DISPLACEMENT METER COMPRISING SUCH AN ELEMENT

BACKGROUND OF THE INVENTION

The invention relates to an optical transducer element for converting displacements of an object connected to said element into an optical signal, which element comprises a flat body provided with a plurality of dark first strips which in the direction of displacement of the element alternate with bright second strips. The invention also relates to a device for measuring rectilinear or angular displacements of an object provided with such an element.

The term "displacements" is to be interpreted in its widest sense. It is to be understood to mean both linear displacements of an object and rotations of an object about a specific object axis. Since the position of an object is the displacement of this object relative to a reference point and the velocity with which an object moves is the derivative of the displacement with respect to time, the transducer element can also be utilized for determining the position or the velocity of an object.

European Patent Application No. 0,096,448 to which U.S. Pat. No. 4,577,101 corresponds describes a device for determining angular displacements of an object, the transducer element being a transparent disc provided with radially extending radiation-reflecting strips. This disc is arranged between a radiation source and a radiation-sensitive detection system. This system comprises a large number of detectors arranged in line. The displacement of an object, for example a part of a machine tool, or the movement of a manipulator in an automated production machine or measuring apparatus can be measured by imaging the strip pattern of the transducer element onto the corresponding strip pattern of the detection system. The individual detectors of this system supply electric pulses depending on the displacement or the position of the object relative to the detection system, which pulses can be processed electronically to form a measurement signal.

In order to obtain the desired resolution of, for example, 0.005° and the desired reproducibility of, for example, 0.001° of the measuring device the transducer element must comply with very stringent requirements with respect to the width of the strips, i.e. their dimension transverse to the direction of movement and the position of these strips. In a specific version of a currently used transducer element for measuring angular displacements in a goniometer the width of the strips is approximately 318 $\mu$m, the positional accuracy of the strip being of the order of 1 $\mu$m. The strips comprise, for example, chromium strips on a glass disc. This disc-shaped transducer element, also referred to as "angular position encoder", must be manufactured with special equipment employing known lithography techniques as used in the fabrication of integrated circuits. The known angular-position encoder discs are comparatively expensive.

There is an increasing need for transducer elements for measuring angular displacements as well as rectilinear displacements, which are substantially cheaper and, preferably, also more accurate.

SUMMARY OF THE INVENTION

Transducer Element

In accordance with a first aspect of the present invention both cast and accuracy requirements are met.

In a novel type of transducer element, each of the first strips is formed by a phase grating comprising grating lines or grooves which are arranged behind each other in the longitudinal direction of the relevant strip and which are disposed at a first level which differs from a second level at which the intermediate grating lands situated between the grating lines are disposed. The grating lines exhibit the same transmittivity or reflectivity as the intermediate grating lands, the difference in level being such that a phase difference of 180° is introduced between the zero-order sub-beam and a first-order sub-beam formed when a part of a radiation beam is incident on the grating. The width of the grating lines is substantially equal to that of the intermediate grating lands, in such a way that the strip-shaped gratings introduce dark bands into a radiation beam originating from the transducer element.

The phase structure of this transducer element has the great advantage that it can be replicated cheaply and in large numbers from a master element. The master for an angular transducer element can be inscribed with very high accuracy using the equipment also employed in the fabrication of a master disc for an optical record carrier containing an audio program or a video program, which are now generally known by the name of "Compact Disc" or "CD" and "Laser Vision Disc" respectively. The "CD" or "Laser Vision" technology can also be utilized in the fabrication of a linear transducer element; that is a transducer element for measuring linear or rectilinear displacements. In this way an angular or linear transducer element can be obtained at a cost of the order of one tenth of the cost of the known transducer element.

On account of said choice of the phase-grating parameters it is achieved that the radiation which is incident on the phase structure is diffracted and cannot reach the detection system, so that "viewed" from the detection system, the phase gratings behave as black strips and the strip structure of the transducer element is observed as a black-and-white or amplitude structure.

The transducer element in accordance with the invention may be entirely transparent. The difference in level between the grating strips and the intermediate grating strips is then approximately $\lambda/2(n_1-n_2)$, where $\lambda$ is the wavelength of the radiation with which the transducer element is scanned, $n_2$ is the refractive index of the substrate of the transducer element, and $n_1$ is the refractive index of a medium covering the phase gratings.

Alternatively, the transducer element is radiation-reflecting. Such an element is characterized further in that the difference in level between the grating strips and the intermediate grating strips is approximately $\lambda/4n$, where n is the refractive index of a medium covering the phase gratings.

However, alternatively the grating strips may comprise areas situated at another level than the intermediate grating lands. These areas are spaced from each other in the grating track direction by intermediate areas situated at the same level as the intermediate grating lands.

In accordance with a preferred embodiment of the invention the transducer element is characterized further in that the phase-grating structure is provided with a transparent coating. This coating protects the grating structure against mechanical damage, such as scratches, and dirt.

Preferably, a reflecting transducer element having a protective coating is characterized further in that the protective coating is constituted by the transparent substrate of this element. The transducer element is then of very simple construction, whilst the phase gratings are fully protected against mechanical damage and dirt because the radiation beam traverses the substrate both on its way towards the grating structure and on its way back from this structure.

Measuring Device

A second aspect of the invention concerns a device, comprising a radiation source and a radiation-sensitive detection system for measuring displacements of an object. According to the invention, a transducer element as defined above is arranged in the radiation path between the radiation source and the detection system, and a limiting aperture is interposed between the transducer element and the detection system. The aperture is selected to transmit radiation issuing from the second strips to the detection system but not to allow the passage of the radiation diffracted by the phase gratings.

This aperture, which suitably comprises a lens aperture of a lens system arranged between the transducer element and the detection system, together with the geometry of the phase gratings, ensures that these gratings are observed as black-and-white strips. The aperture may be that of the lens element situated nearest the transducer element.

The detection system suitably comprises a multiple photocell comprising an array of linear diodes which are connected, by an electronic switch, to an electronic circuit which processes the signals generated in the diodes. Such a multiple photocell is described in U.S. Pat. No. 3,973,119.

In a device for measuring angular displacements special measures have to be taken in order to match the radial strip pattern of the transducer element and the strip pattern of the detection system to one another. If the detection system comprises a plurality of detectors arranged in line, an optical system, comprising refractive and/or reflecting surfaces may be arranged between the transducer element and the detection system to convert the radial strip pattern of the transducer element into a linear strip pattern. Different versions of such an optical system are described in U.S. Pat. No. 4,577,101.

However, in a preferred embodiment the displacement measuring device is characterized further in that the photodiodes of the multiple photocell are arranged along a curve which coincides with the curvature of the image of the strip pattern of the transducer element formed at the location of the photocell.

An angular displacement measuring device in which the transducer element in accordance with the invention is combined with a curved or radial multiple photocell can be manufactured at substantially lower cost than a known device and, moreover, exhibits a higher measurement accuracy.

Embodiments of the invention will be described in more detail, by way of example, with reference to the accompanying drawings.

DESCRIPTION OF THE PREFERRED EMBODIMENTS

Figure 1A:
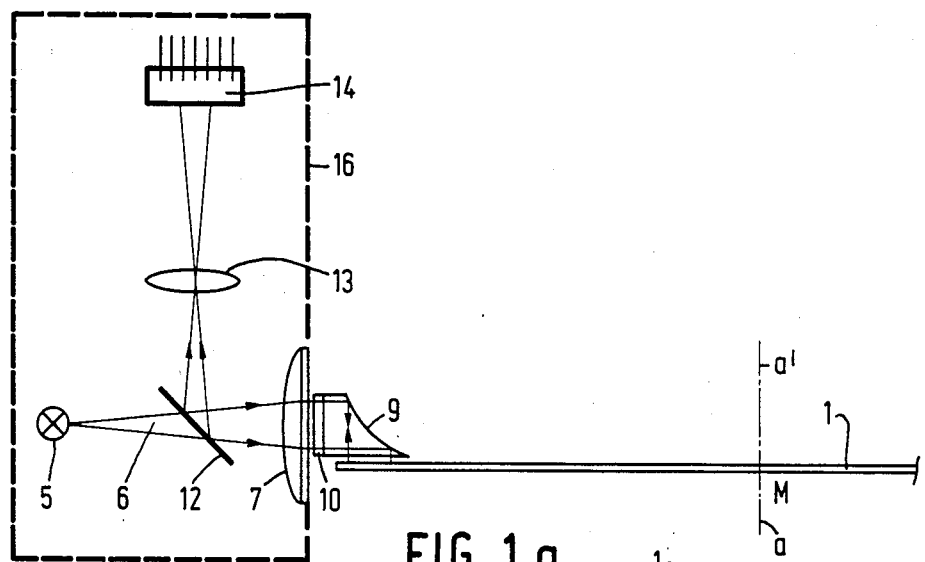
FIGS. 1a and 1b are respectively a side view and a plan view of an angular displacement measuring device employing a reflecting transducer element in accordance with the invention.
Figure 1B:
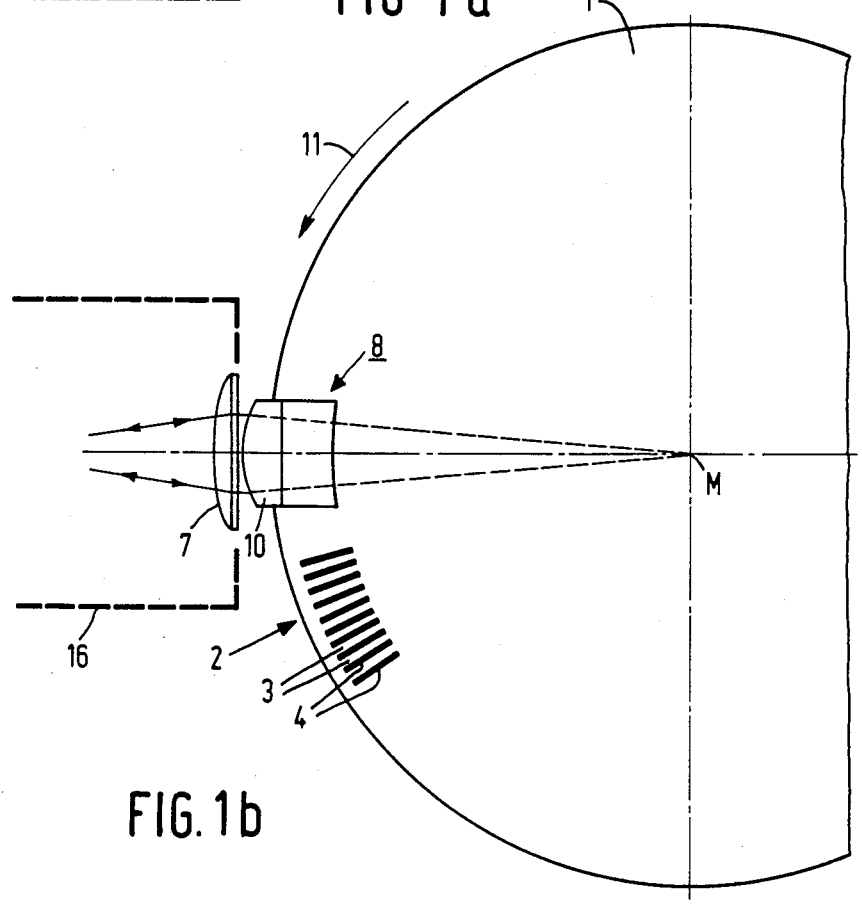

FIGS. 1a and 1b show a round disc 1 having a center M. The disc constitutes the angular transducer element and is connected to an object, not shown, whose rotation is to be measured. This disc may form part of a goniometer or manipulator by means of which a specimen of a substance to be analysed is arranged at a specific angle relative to, for example, a beam of measurement radiation. Goniometers are employed, for example, in spectrometers or microscopes operating with X-rays. The disc may also form part of an angular transducer in a machine tool.

The disc 1 is provided with a pattern 2 of equidistant reflecting strips 3 which alternate with non-reflecting strips 4. The disc is illuminated by a beam 6 originating from a radiation source 5, for example a light-emitting diode (LED) or a diode laser. The source 5 is arranged in the focal plane of a field lens 7 which ensures that the beam 6 emerges as a parallel beam. The beam which traverses the field lens is reflected to the disc by a reflecting element 9. The radiation which is reflected by the disc 1 is projected to a radiation-sensitive detection system, for example a multiple photocell 14, via the element 9, the field lens 7, a semitransparent mirror 12 and an objective 13.

Figure 2:
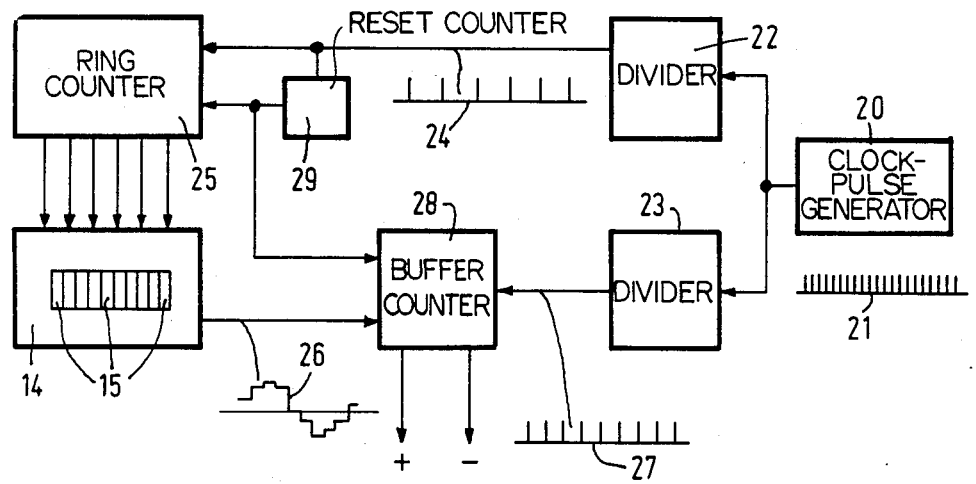
FIG. 2 is a block diagram of the electronic processing circuit employed in this device.

FIG. 2 gives a front view of the multiple photocell 14 and a block diagram of the signal-processing circuit. The photocell 14 comprises a comparatively large number of photosensitive elements, such as photodiodes 15, arranged in a comparatively small number of groups. Consequently, each group comprises a large number of photodiodes. The number of photodiodes per period of a projected track pattern 2 should be as large as possible in order to ensure a most faithful electrical reproduction of the optical signal. On the other hand, the track pattern 2, which comprises for example 720 strips 3 and 720 strips 4 over its entire circumference, should be scanned over an area which is as large as possible.

In an example of a multiple photocell 14 the number of photodiodes is 220 and the length of each photodiode is 1.8 mm. The width of each photodiode is approximately 10 μm and the spacing between the photodiodes is also approximately 10 μm. The number of photodiodes per period of the track pattern 2 is ten, so that the field of view covers 22 periods. Corresponding photodiodes of each set of 10 succeeding photodiodes are interconnected, which means that there are ten groups of 22 photodiodes each.

By means of the multiple photocell 14 it is possible to simulate a stationary strip structure having a black-white ratio of 1:1 by activating five successive groups of photodiodes. A travelling strip pattern arises when the set of five groups each time moves one group.

In the processing circuit shown in block schematic form in FIG. 2 clock pulses 21 generated in a clock-pulse generator 20 are applied to a divider 22 and a divider 23. The divider 22 supplies pulses 24 which drive a ring counter 25. The multiple photocell 14 is activated by the ring counter 25 and supplies the measurement signal 26. The divider 23 supplies pulses 27 (usually of another repetition rate than the control pulses 24 from the divider 22) to form a reference signal. In the buffer counter 28 the measurement signal 26 and the reference pulses 27 are compared with each other. The output pulses of the buffer counter 28 are applied to, for example, an indicator.

The ring counter 25 activates the successive groups of photodiodes of the multiple photocell 14, giving the effect of a strip pattern travelling over the surface of the photocell 14 with a constant velocity. The period of this pattern is equal to that of the projection of the pattern 2 on the photocell 14. When the pattern 2 is stationary relative to the photocell 14 the measurement signal has a constant frequency. If the projection of the pattern 2 moves in the same direction as the apparent strip pattern activated by the ring counter 25, the frequency of the measurement signal 26 decreases, whilst in the case of a movement in the opposite direction the frequency of the measurement signal 26 increases. In this way the direction and magnitude of the displacement of the strip pattern 2 and hence the displacement of the object can be determined.

Within a range of one period of the strip pattern 2 the position of the multiple photocell 14 relative to the pattern 2 can be determined in an absolute manner by measuring the phase difference between the measurement signal 26 and the reset signal of the ring counter 25. Each time that a measurement is started the ring counter 25 must be reset in order to guarantee that the counter 28 starts counting from a well-defined initial state.

However, the circuit becomes simpler and more reliable if the ring counter 25 is reset after every period. The reset signal is obtained by dividing the pulses 24 in the counter 29. The frequency of the reset pulses is selected to equal the nominal frequency of the measurement signal 26.

In the angular-displacement measuring device in accordance with the present embodiment optical elements are arranged in the radiation path between the disc 1 and the field lens 7 to ensure that the radial strip pattern 2 is imaged on the multiple photocell 14 as a parallel strip pattern. As is shown in FIGS. 1a and 1b, these elements may comprise a cylindrical lens 10 and a reflector 9 of conical shape. The operation of these elements is described in U.S. Pat. No. 4,577,101, which also describes alternative optical systems for converting a radial track pattern into a linear track pattern.

Instead of a multiple photocell it is also possible to employ a combination of a linear pattern of alternate radiation-transmitting and non radiation transmitting strips behind which a single detector is arranged.

The Transducer

Figure 3:
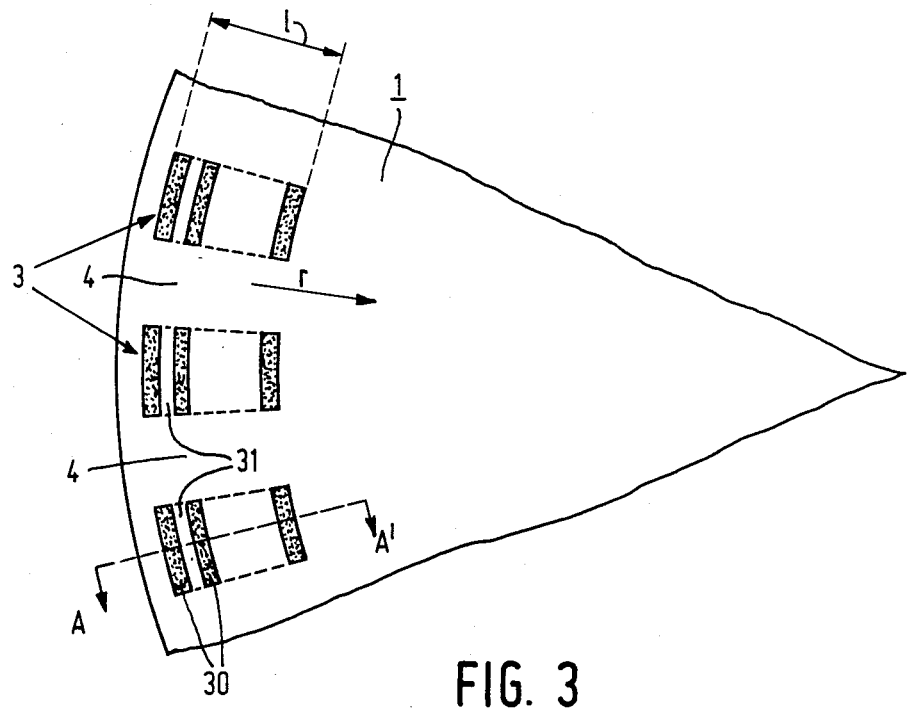
FIG. 3 is a plan view of a part of an angular transducer element in accordance with the invention.
Figure 4:
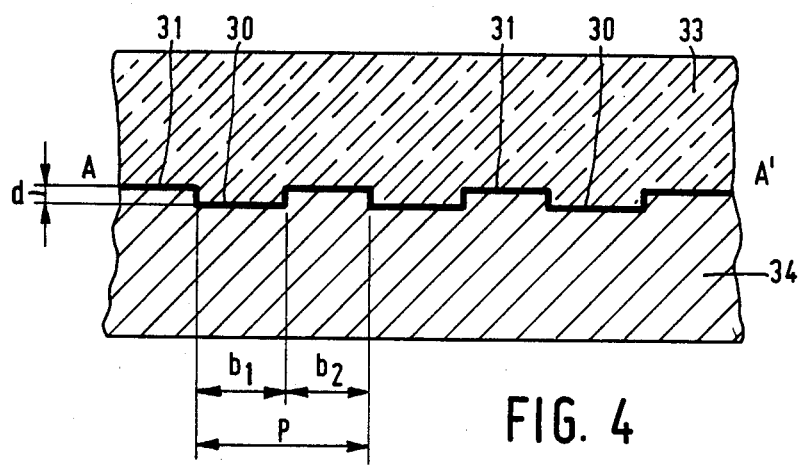
FIG. 4 is a cross-sectional view of a phase grating of this element in a first embodiment.

In accordance with the invention the strips 4 of the angular transducer element are formed by phase gratings. FIG. 3 is a plan view of a part of this transducer and FIG. 4 is a cross-sectional view of the grating taken on the line AA' in FIG. 3. A phase grating 4 comprises a plurality of grating grooves 30 which in the radial direction r of the disc alternate with intermediate lands 31. The width $b_1$ of the grating grooves is equal to the width $b_2$ of the intermediate lands and is consequently equal to half the grating period p. This period is of the order of 1 $\mu$m and in a specific example it is equal to 1.2 $\mu$m. In this example the width $b_1$ is consequently 0.6 $\mu$m.

The beam 6 which is incident on the disc 1 may be thought of as comprising beam components or primary beams having a width in the direction of displacement equal to the width of one grating 4. Since the wavelength of the beam 6 is of the order of the width $b_1$ of a grating groove, a grating 4 will split an incident primary beam into a non-diffracted zero-order beam and a plurality of diffracted first and higher-order sub-beams. The angle at which the first-order beams are diffracted is given by $\sin \beta = \lambda/p$, so that for the wavelength value considered here, for example 900 nm, the angle $\beta$ is some tens of degrees. In FIG. 1a the field lens 7 has a specific numerical apertures, such that the first-order sub-beams and also the higher-order sub-beams which are diffracted at larger angles cannot pass the field lens and consequently cannot reach the detection system 14.

The zero-order sub-beam, which in the case of perpendicular incidence of the primary beam on a phase grating 4 is reflected in the direction of this primary beam, can traverse the objective. Since the widths $b_1$ and $b_2$ are equal the zero order sub-beam contains equal amounts of radiation originating from the grating grooves 30 and from the intermediate lands 31. Moreover, as the optical path lengths for the radiation components originating from the grating grooves 30 differ by half a wavelength from the optical pathlength for the radiation components originating from the intermediate lands 31, there is a phase difference of 180° between these two radiation components, and these radiation components will cancel each other. This means that the detection system 14 receives no radiation from the phase gratings 4, and that the phase gratings are observed as absorbing strips. The primary beams incident on the reflecting strips 3 are not diffracted, so that these strips reflect radiation towards the detection system. Thus, an angular transducer element in accordance with the invention operates in the same way as the known transducer comprising radiation-reflecting strips on a glass plate. However, the transducer element in accordance with the invention can be manufactured substantially cheaper and with a higher accuracy than the known disc.

The optical pathlength difference of half a wavelength can be obtained by giving the grating grooves 30 a depth of a quarter wavelength in the case of a reflecting transducer element in which the phase gratings 4 and the reflecting strips 3 adjoin air.

Preferably, the transducer element is coated with a transparent coating, 33 in FIG. 4, which protects the grating structure from mechanical damage. If this protective coating has a refractive index n, the depth of the grating grooves should be approximately $\lambda/4n$.

Figure 5:
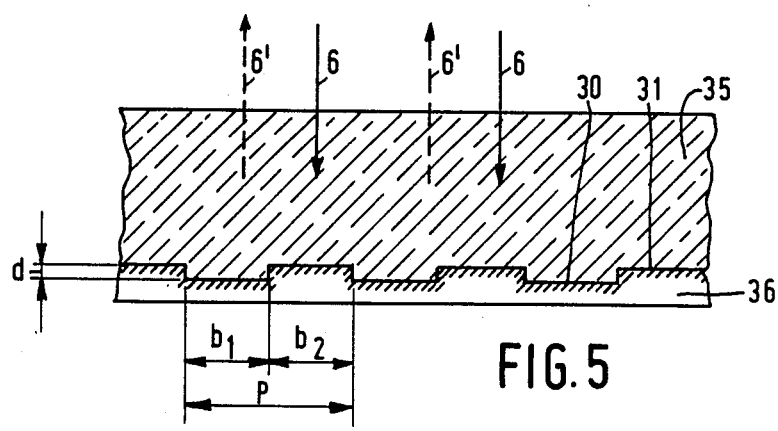
FIG. 5 is a cross-sectional view of a phase grating of this element in a second embodiment.

In a very suitable embodiment a reflecting transducer element comprises a transparent substrate, 34 in FIG. 4, which acts as the protective coating. FIG. 5 schematically shows this embodiment in a sectional view similar to that in FIG. 4. In FIG. 5 the incident radiation is indicated by the arrows 6 and the reflected radiation by the arrows 6'. In addition, the back of the transducer element shown in FIG. 5 may be provided with a thin layer 36 to prevent the phase structure from being damaged through the back. As the layer 36 is not traversed by the measurement radiation this layer need not comply with special optical requirements. The layer 36 may be a foil attached to the transducer element or a lacquer coating.

The advantage of the use of a reflecting transducer element is that the displacement measuring device can be compact and that all the elements, except for the transducer element and, if applicable, the elements 9 and 10, can be accommodated in one housing, which bears the reference numeral 16 in FIG. 1a.

Alternatively, the transducer element in accordance with the invention may be radiation-transmitting. In order to obtain the desired phase difference of 180° between the radiation components originating from the grating grooves 30 and the radiation components originating from the intermediate lands 31, the depth d of the grating grooves should be substantially equal to $\lambda/2(n_1-1)$ in the case that the grating structure borders on air. Here, $n_1$ is the refractive index of the substrate. If the grating structure is covered with a transparent protective layer having a refractive index $n_2$, the groove depth is equal to $d=\lambda/2(n_1-n_2)$.

Figure 6:
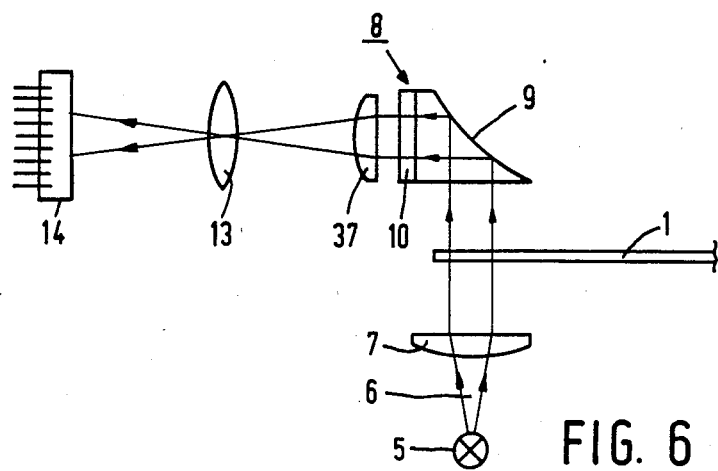
FIG. 6 is an angular displacement measuring device comprising a radiation-transmitting angular transducer element.

FIG. 6 shows an angular-displacement measuring device comprising a radiation-transmitting transducer element. The radiation source 5 and the field lens 7 are arranged at one side, for example, the lower side of the element 1 and the reflecting conical surface 9, the cylindrical lens 10, a second field lens 37, the objective 13 and the radiation-sensitive detection system are arranged at the other side.

In order to simplify the explanation of the operation of the angular transducer element it is assumed that the grating grooves 30 have straight walls. However, in practice the walls are generally inclined. The optimum depth d of the bottom of the grating grooves will then be larger than the values of $\lambda/4n$ specified above for a reflecting element and $\lambda/2(n_1-n_2)$ for a radiation of transmitting element. For the calculation of the effect of such grooves use is made of a strictly vectorial diffraction theory as disclosed in U.S. Pat. No. 4,230,915, which describes the information pits or hills of an optical record carrier containing an audio program (Compact Disc) or a video program. In accordance with the vectorial diffraction theory as stated in that U.S. patent an optimum read signal is obtained if the depth of the pits or the height of the hills is such that a phase difference of 180° is introduced between the zero-order sub-beam and the first-order sub-beam. The same requirement holds for an optimum cancellation of radiation by the grating structure of the present transducer element.

Instead of grooves the grating lines 30 of the phase gratings 4 may comprise ribs on the surface of the disc.

A large number of angular transducer elements in accordance with the invention can be manufactured comparatively cheaply by one time scanning a photosensitive layer deposited on a round disc by means of a tiny light spot. This spot is moved over the disc in concentric circles, the radiation of the spot being switched on and off periodically to form a pattern of concentric tracks in which exposed annular segments alternate with non-exposed annular segments and corresponding segments of consecutive tracks have the same radial positions. After the entire disc has been scanned, the exposure pattern is converted into a depth or height profile in known manner. From the disc or master thus manufactured a large number of copies can be made using known replica techniques. When the mastering and replica techniques known from the "Compact Disc" or "Laser Vision" technology are used the desired patterns can be formed with very high accuracy.

Figure 7:
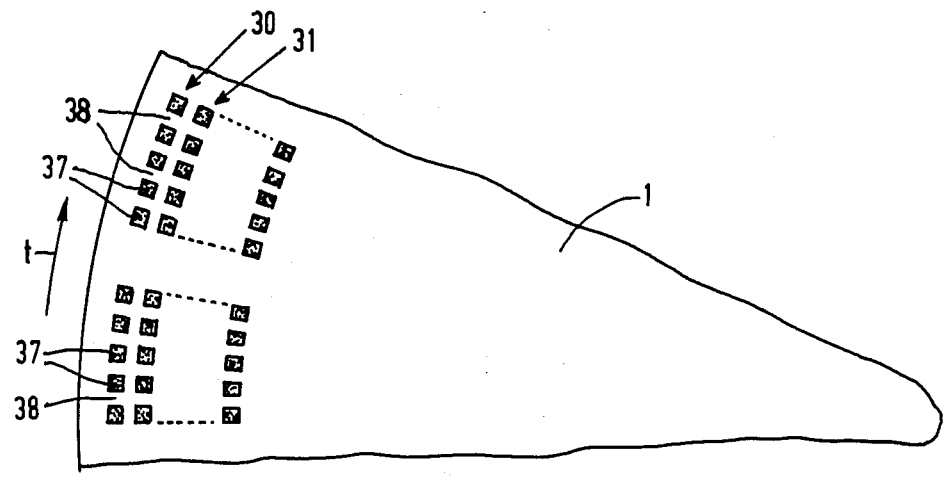
FIG. 7 is a plan view of a part of an angular transducer element, in another embodiment.

The grating lines 30 of the transducer element in accordance with the invention need not comprise continuous grooves or ribs but may alternatively comprise a sequence of pits, or hills, 37 which alternate with intermediate areas 38 in the direction of the grating lines 30; for example, in the tangential direction t of the disc, as is shown in FIG. 7. This figure shows a part of such a transducer disc in plan view. The depth of the pits, or the height of the hills, 37 should comply with the same requirements as specified hereinbefore for the depth or height of the grating grooves or grating ribs 30. The length of the areas 36 in the tangential direction t is equal to that of the intermediate areas 38.

As a result of the division of the grating grooves or ribs into pits or hills 37 a beam which is incident on a grating 4 is not only diffracted in the radial direction but also in the tangential direction outside the first pupil of the imaging system (7, 13), so that the radiation of this beam cannot reach the detection system 14.

The transducer element shown in FIG. 7 is manufactured in a way similar to that described for the transducer element comprising continuous grating grooves or ribs, the only difference being that during inscription of the grating strips themselves the radiation spot is switched on and off with a high frequency.

An embodiment of the angular transducer element in accordance with the invention comprises 742 gratings 4 and 742 intermediate strips 3. The period of the track structure in the tangential direction is 635 $\mu$m, the strips 3 and 4 having the same width. The gratings 4 have a length (l in FIG. 3) of 10 mm and these gratings are centered on a radius of approximately 50 mm. Within the gratings the grating period p is 1.2 $\mu$m and the width of the grating lines or grooves and that of the intermediate grating lands is 600 nm. The depth d of the grooves 30 is approximately 150 nm for a refractive index n=1.5 of the protective coating formed by the substrate 35, which is made of polymethyl methacrylate (PMMA) or polycarbonate (PC). This transducer is used in conjunction with a light-emitting diode with a wavelength of 900 nm. The positional accuracy of the phase gratings 4 in the tangential direction is approximately 100 nm. When this transducer is used in an angular-displacement measuring device comprising a multiple photocell as the detection system, a measurement accuracy of approximately 0.3 seconds of arc or 0.0001° can be obtained.

The present invention not only provides the angular transducer element described above but also an elongate transducer element for measuring rectilinear displacements. The latter element differs from the angular transducer element only in that the phase gratings comprise straight lines on a rectangular plate instead of segments on a circular disc, the lines extending transversely of the longitudinal direction of the plate. The linear transducer element can also be manufactured cheaply with a high accuracy and in large numbers by means of Compact-Disc mastering and replica techniques, in which case the equipment requires some adaptation in view of the elongate shape of the transducer element.

Figure 8:
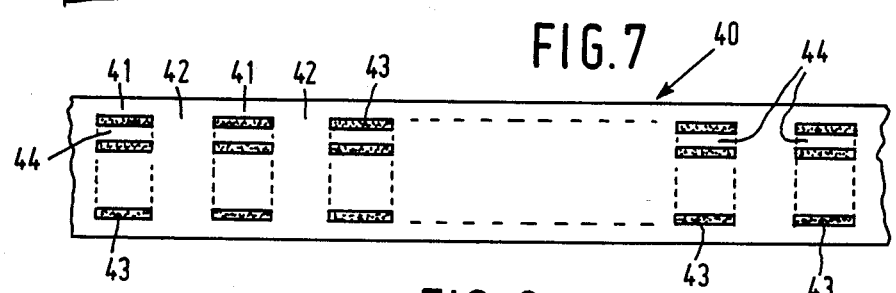
FIG. 8 shows a part of a transducer element in accordance with the invention for measuring rectilinear displacements.

FIG. 8 is a plan view of a part of the transducer element 40 having phase gratings 41 and reflecting or transparent intermediate strips 42. The gratings 41 are formed by grooves or ribs 43 and intermediate grating lands 44. The linear transducer element may be constructed in the same way as described for the angular transducer element with reference to FIGS. 4, 5 and 7.

Measuring Devices

Figures 9, 10:
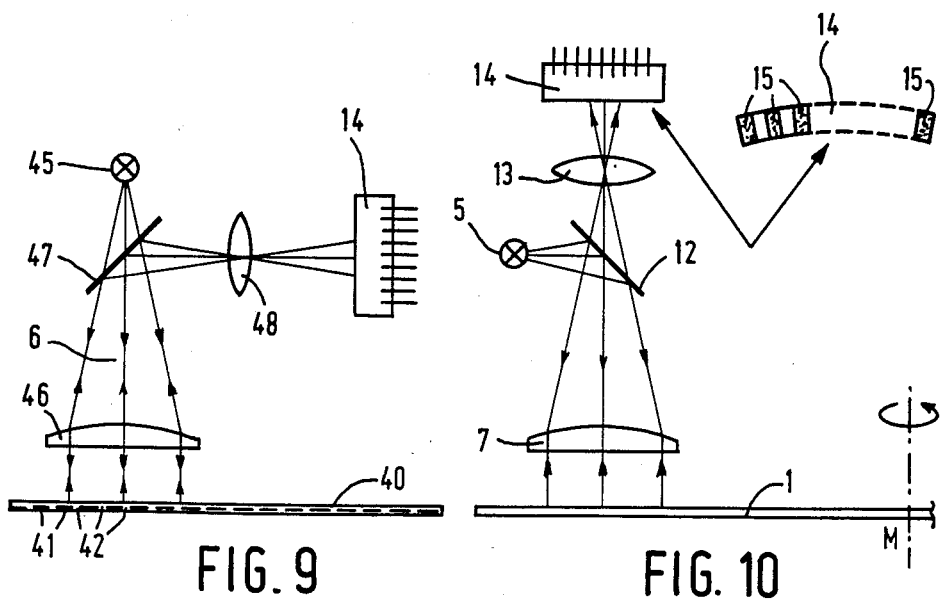
FIG. 9 shows a device for measuring rectilinear displacements comprising such an element.

FIG. 9 shows schematically a device for measuring rectilinear displacements, comprising a transducer element as shown in FIG. 8. In this figure a radiation source 45 is arranged in the focal plane of the field lens 46, so that the illumination beam 6 is collimated to be a parallel beam. The radiation reflected by this transducer element 40 is projected by the objective 48 and a semi-transparent mirror 47 onto a radiation sensitive detection system, for example a multiple photocell 14.

The grating grooves or ribs 43 may again comprise pits or hills.

An angular displacement measuring device which is very suitable in respect of its accuracy and cost is that in which the angular transducer element in accordance with the invention is combined with a multiple photocell comprising photodiodes arranged along a curve adapted to the curve passing through the centers of the phase gratings on the transducer element. The use of the elements 9 and 10, which have to be aligned accurately, can then be avoided. FIG. 10 shows schematically the angular displacement measuring device. This figure, in which the reference numerals corresponds to those in the FIG. 1a, requires no further explanation after the description of FIG. 1a.

What is claimed is:

1. An optical transducer element for converting displacements, in a given direction, of an object connected to said element into an optical signal,
    said element comprising a flat body having a plurality of dark first strips and a corresponding plurality of bright second strips, said first strips and said second strips alternating respectively in said direction,
    characterized in that each of said first strips is formed by a phase grating, each phase grating extending in a longitudinal direction orthogonal to said given direction, and comprising a multiplicity of grating lines disposed transversely to said longitudinal direction at a first level, alternating with respective intermediate grating lands disposed at a second level differing from said first level,
    said grating lines having a same transmittivity or reflectivity as said intermediate grating lands, and said lines and lands each having a same width in said longitudinal direction,
    said first and second levels being so spaced that, responsive to a first radiation beam being incident on the element in a first direction, to produce a second radiation beam originating from the element having a part in a direction generally parallel to said first direction, a phase difference of 180° is introduced between a zero-order sub-beam and a first-order sub-beam originating from said element, thereby introducing dark bands into said part of said second radiation beam.

2. An element as claimed in claim 1, characterized by comprising a round disc-shaped substrate in which said first strips are sectors of equal width, and said second strips are sectors having a same equal width.

3. An element as claimed in claim 1, characterized in that said phase grating is provided with a transparent coating.

4. An element as claimed in claim 1, characterized in that said first strips comprise areas situated at a level different from said intermediate grating lands, said areas being spaced from each other in said longitudinal direction by intermediate areas disposed at a same level as said lands.

5. An element as claimed in claim 1, characterized in that said first strips are continuous strips.

6. An element as claimed in claim 1, for use as a radiation-reflecting element with a first radiation beam having a wavelength $\lambda$,
    characterized in that the element further comprises a refractive medium covering the phase grating, having an index of refraction n, and said lines and lands are spaced a difference in level substantially equal to $\lambda/4n$.

7. An element as claimed in claim 3, having a radiation-reflecting phase grating structure, characterized in that the protective coating is constituted by a transparent substrate on which the element is formed.

8. An element as claimed in claim 5, characterized in that said phase grating is provided with a transparent coating.

9. An element as claimed in claim 6, characterized in that said first strips are continuous strips.

10. An element as claimed in claim 6, characterized in that said first strips comprise areas situated at a level different from said intermediate grating lands, said areas being spaced from each other in said longitudinal direction by intermediate areas disposed at a same level as said lands.

11. An element as claimed in claim 10, characterized in that said phase grating is provided with a transparent coating.

12. An element as claimed in claim 11, having a radiation-reflecting phase grating structure, characterized in that the protective coating is constituted by a transparent substrate on which the element is formed.

13. An element as claimed in claim 12, characterized in that said substrate is a round disc-shaped substrate in which said first strips are sectors of equal width, and said second strips are sectors having a same equal width.

14. An element as claimed in claim 12, characterized in that said substrate is a round disc-shaped substrate in which said first strips are sectors of equal width, and said second strips are sectors having a same equal width.

15. A device for measuring displacement of an object, comprising a radiation source and a pattern-sensitive radiation detection system,
    said system comprising means for detecting displacement of a flat body having a plurality of dark first strips and a corresponding plurality of bright second strips, said first strips and said second strips alternating respectively in a direction of displacement,
    characterized in that each of said first strips is formed by a phase grating, each phase grating extending in a longitudinal direction orthogonal to said given direction, and comprising a multiplicity of grating lines disposed transversely to said longitudinal direction at a first level, alternating with respective intermediate grating lands disposed at a second level differing from said first level,
    said grating lines having a same transmittivity or reflectivity as said intermediate grating lands, and said lines and lands each having a same width in said longitudinal direction, said first and second levels being so spaced that, responsive to a first radiation beam being incident on the element in a first direction, to produce a second radiation beam originating from the element having a part in a direction generally parallel to said first direction, a phase difference of 180° is introduced between a zero-order sub-beam and a first-order sub-beam originating from said element, thereby introducing dark bands into said part of said second radiation beam, said system comprising means for focusing said part of said second radiation beam onto said detector, said means for focusing including a limiting aperture disposed between said element and said detector, said aperture inhibiting transmission of first and higher order diffraction beams from said phase gratings to said detector.

16. A device as claimed in claim 15, for measuring angular displacement of an object, in which said detector is an array of linear diodes, and said detection system comprises an electronic circuit and an electronic switch for consecutively connecting said diodes to said circuit for processing signals generated in said diodes, characterized in that said devices comprises means forming a curved image of a pattern formed by said first and second strips, at the location of said linear diodes, and said linear diodes are arranged along a curve coinciding with said curved image.

17. A device as claimed in claim 15, for use as a radiation-reflecting element with a first radiation beam having a wavelength $\lambda$, characterized in that the element further comprises a refractive medium covering the phase grating, having an index of refraction n, and said lines and lands are spaced a difference in level substantially equal to $\lambda/4n$.

18. A device as claimed in claim 15, characterized in that said first strips comprise areas situated at a level different from said intermediate grating lands, said areas being spaced from each other in said longitudinal direction by intermediate areas disposed at a same level as said lands.

19. A device as claimed in claim 17, for measuring angular displacement of an object, in which said detector is an array of linear diodes, and said detection system comprises an electronic circuit and an electronic switch for consecutively connecting said diodes to said circuit for processing signals generated in said diodes, characterized in that said devices comprises means forming a curved image of a pattern formed by said first and second strips, at the location of said linear diodes, and said linear diodes are arranged along a curve coinciding with said curved image.

20. A device as claimed in claim 18, for measuring angular displacement of an object, in which said detector is an array of linear diodes, and said detection system comprises an electronic circuit and an electronic switch for consecutively connecting said diodes to said circuit for processing signals generated in said diodes, characterized in that said devices comprises means forming a curved image of a pattern formed by said first and second strips, at the location of said linear diodes, and said linear diodes are arranged along a curve coinciding with said curved image.

* * * * *